US009459303B2

(12) United States Patent
Roederer et al.

(10) Patent No.: US 9,459,303 B2
(45) Date of Patent: Oct. 4, 2016

(54) METHOD AND DEVICE FOR IDENTIFYING AN ALLOCATION OF CONTROL CIRCUITS TO AT LEAST ONE CONTROL DEVICE

(71) Applicants: Karsten Roederer, Hamburg (DE); Maik Jalass, Otter (DE)

(72) Inventors: Karsten Roederer, Hamburg (DE); Maik Jalass, Otter (DE)

(73) Assignee: Airbus Operations GmbH, Hamburg (DE)

( * ) Notice: Subject to any disclaimer, the term of this patent is extended or adjusted under 35 U.S.C. 154(b) by 645 days.

(21) Appl. No.: 13/659,067

(22) Filed: Oct. 24, 2012

(65) Prior Publication Data

US 2013/0119971 A1     May 16, 2013

Related U.S. Application Data

(63) Continuation of application No. PCT/EP2011/056518, filed on Apr. 26, 2011.

(60) Provisional application No. 61/328,304, filed on Apr. 27, 2010.

(30) Foreign Application Priority Data

Apr. 27, 2010    (DE) ........................ 10 2010 028 263

(51) Int. Cl.
    *G01R 31/02*        (2006.01)
    *G05B 19/042*      (2006.01)
                     (Continued)

(52) U.S. Cl.
    CPC ............ *G01R 31/02* (2013.01); *G05B 19/0425* (2013.01); *G05B 23/0256* (2013.01);
                     (Continued)

(58) Field of Classification Search
    CPC .. G01R 31/023; G01R 29/18; G01R 31/021; G01R 31/041
    USPC ............................................................ 324/66
    See application file for complete search history.

(56) References Cited

U.S. PATENT DOCUMENTS 2,488,556 A  *  11/1949   Parmenter ............ G01R 31/023
                                                             324/66
3,252,087 A  *  5/1966     Parke ................... G01R 31/023
                                                             29/593

(Continued)

FOREIGN PATENT DOCUMENTS

DE            10242007        5/2003
DE      10 2004 015 617    11/2004
                 (Continued)

OTHER PUBLICATIONS

German Exam Report for Serial No. 10 2010 028 263.4 55 dated Jan. 17, 2011.

(Continued)

*Primary Examiner* — Jermele M Hollington
*Assistant Examiner* — Christopher McAndrew
(74) *Attorney, Agent, or Firm* — Jenkins, Wilson, Taylor & Hunt, P.A.

(57) ABSTRACT

The present invention relates to a method and a device for identifying an allocation of control circuits to at least one control device. In this context, it can be checked whether wiring for example of heating circuits and/or sensors to a central control device is correct. Provided actuation patterns are switched on at a number of control circuits. This makes it possible to identify correct wiring efficiently and without error. The invention can be used in vehicle construction, and especially in aircraft construction.

9 Claims, 7 Drawing Sheets

(51) Int. Cl.
*G05B 23/02* (2006.01)
*G01R 29/18* (2006.01)
*G01R 31/04* (2006.01)

(52) U.S. Cl.
CPC ............. *G01R29/18* (2013.01); *G01R 31/021* (2013.01); *G01R 31/023* (2013.01); *G01R 31/041* (2013.01); *G05B 2219/21058* (2013.01); *G05B 2219/2604* (2013.01)

(56) References Cited

U.S. PATENT DOCUMENTS

| | | | | |
|---|---|---|---|---|
| 3,288,945 A * | 11/1966 | McNair, Jr. | ............ | G01R 31/023 324/66 |
| 3,407,480 A * | 10/1968 | Friedrich | ............ | G01R 31/041 29/407.04 |
| 3,427,538 A * | 2/1969 | Bohnenblust | ........ | G01R 31/023 324/66 |
| 3,476,442 A * | 11/1969 | Sarbach | .................. | B60T 17/20 303/19 |
| 3,534,904 A * | 10/1970 | Bandenburg | .......... | G06F 3/0238 234/124 |
| 3,564,498 A * | 2/1971 | Stern | .................... | G06K 9/6202 382/205 |
| 3,903,380 A * | 9/1975 | Schomburg | .......... | G01R 31/023 324/66 |
| 3,976,939 A * | 8/1976 | Cruce | .................. | G01R 31/023 324/66 |
| 4,017,876 A * | 4/1977 | Coughlan | ................. | G03B 9/42 396/450 |
| 4,173,736 A * | 11/1979 | Adams | ............... | G01R 27/2605 324/519 |
| 4,445,086 A | 4/1984 | Bulatao | | |
| 4,471,293 A * | 9/1984 | Schnack | ............. | G01R 31/023 324/540 |
| 4,814,693 A * | 3/1989 | Coben | ................. | G01R 31/023 324/540 |
| 4,914,566 A * | 4/1990 | Steutermann | ........ | G05B 19/291 251/129.01 |
| 5,497,094 A * | 3/1996 | George | ................ | G01R 31/041 324/529 |
| 5,512,835 A * | 4/1996 | Rivera | ................... | G01N 27/82 324/654 |
| 5,714,889 A * | 2/1998 | Alahuhtala | ............ | G01R 29/18 324/108 |
| 6,771,178 B2 | 8/2004 | Bruzy et al. | | |
| 6,806,847 B2 | 10/2004 | Nixon et al. | | |
| 6,813,537 B2 * | 11/2004 | Linehan | .................. | B29C 45/78 324/537 |
| 6,877,669 B2 * | 4/2005 | Sunaga | ............ | B60H 1/00857 236/51 |
| 6,898,542 B2 | 5/2005 | Ott et al. | | |
| 6,915,171 B2 * | 7/2005 | Mayer | .................. | G05B 19/042 700/13 |
| 7,010,450 B2 | 3/2006 | Law et al. | | |
| 7,061,202 B2 * | 6/2006 | Sunaga | ............ | B60H 1/00835 165/202 |
| 7,078,886 B2 * | 7/2006 | Bregaint | ............ | G05B 19/128 324/503 |
| 7,245,271 B2 | 7/2007 | Nixon et al. | | |
| 7,305,067 B1 * | 12/2007 | Diggle, III | ............ | H04M 3/308 324/66 |
| 7,580,777 B2 * | 8/2009 | Smith | .................... | B64D 15/14 244/134 D |
| 8,076,923 B2 * | 12/2011 | Suozzo | ................ | G01R 31/024 324/66 |
| 2002/0096573 A1 * | 7/2002 | Bruzy | ................ | B60H 1/00835 236/75 |
| 2004/0232872 A1 * | 11/2004 | Sunaga | ............. | B60H 1/00857 318/652 |
| 2009/0153129 A1 * | 6/2009 | Campfens | ............ | G01R 31/085 324/66 |
| 2011/0005247 A1 | 1/2011 | Gleine | | |
| 2011/0161022 A1 * | 6/2011 | Caird | ..................... | G01R 29/18 702/62 |
| 2012/0098461 A1 * | 4/2012 | Xie | ........................ | G01R 29/18 315/297 |

FOREIGN PATENT DOCUMENTS

| | | |
|---|---|---|
| DE | 103 32 194 | 3/2005 |
| DE | 10 2008 005 700 | 7/2009 |
| EP | 0088163 | 9/1983 |
| EP | 1226989 | 7/2002 |
| WO | WO 2011/134926 | 11/2011 |

OTHER PUBLICATIONS

International Search Report for Serial No. PCT/EP2011/056518 dated Oct. 26, 2011.

\* cited by examiner

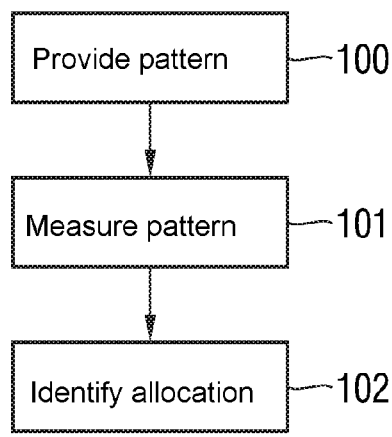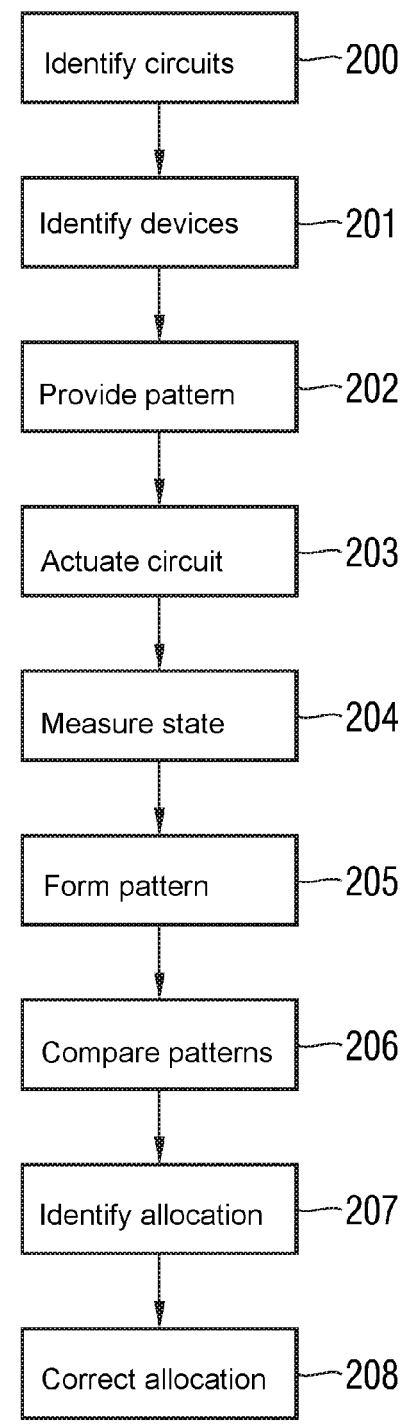

METHOD AND DEVICE FOR IDENTIFYING AN ALLOCATION OF CONTROL CIRCUITS TO AT LEAST ONE CONTROL DEVICE

CROSS-REFERENCE TO RELATED APPLICATIONS

This application is a continuation of and claims priority to PCT/EP2011/056518 filed Apr. 26, 2011 which claims the benefit of and priority to U.S. Provisional Application No. 61/328,304, filed Apr. 27, 2010 and German Patent Application No. 10 2010 028263.4 filed Apr. 27, 2010, the entire disclosures of which are herein incorporated by reference.

FIELD OF THE INVENTION

The present invention relates to a method for detecting wirings of a plurality of appliances to at least one further appliance and in particular to a method for identifying an allocation of control circuits to at least one control device. The invention further relates to a corresponding device for identifying an allocation of control circuits to at least one control device and to a computer program product comprising program instructions for carrying out the method and a data memory for storing the computer program product.

BACKGROUND OF THE INVENTION

A plurality of appliances, which are actuated by means of a central control unit, are typically installed in complex appliances and machines. In this context, the plurality of devices can be connected to the central control unit by means of wired connections. A wired connection is for example produced between each individual installed appliance and an interface, which is specifically provided for this purpose, in the central control unit. So as to ensure correct data transfer between the plurality of appliances and the central control device, the interfaces of the central control device are typically adapted to the respectively connected appliances. It may thus be necessary for each individual appliance to be connected precisely to the interface of the central control device which is provided for this purpose. In this context, however, it is possible for the wires to be accidentally connected the wrong way around, in particular if there is a large number of devices to be connected. In this case, not every connected appliance communicates with the central control device via the interface which is provided for this purpose. This can result in incorrect data transfer or actuation of unsuitable appliances. Checking whether existing wiring is correct, that is to say whether every appliance is connected to the interface which is provided therefor, is time-consuming. In addition, the amount of work involved in checking varies depending on the respective positions or location of the wiring within the machine. Further, in the case of closed cable ducts, it may be virtually impossible to check whether pre-existing wiring is correct.

Conventional methods for checking wiring connections are used for example for checking heating systems in aircraft. DE 10 2008 005 700 A1 discloses a system for preventing ice-ups in a pipeline, which may occur for example in a pipeline of an aircraft water system. In this context, heating circuits are provided inside an aircraft and prevent on-board components of the aircraft from icing up. A heating circuit of this type may comprise a plurality of controllers or control units, for example an IPCU, also known as an ice protection control unit, which in turn comprise a plurality of heating units and corresponding heat detectors. The heating members and sensors which are connected to the controllers can be distributed throughout the aircraft and ensure for example the operation of a water system of the aircraft in cold ambient conditions. In the case of incorrect wiring, faultless operation of the heating system cannot be ensured by conventional methods.

In accordance with further conventional methods, manual tests are carried out, in which each heating means is set in operation individually, and after a heating phase the connected sensor system is read out. A temperature increase in the heating member is read off by way of changes in resistance in the corresponding sensor. The temperature change in the heating member and thus the detection of the temperature sensor require a particular waiting time, for example 5 minutes for each test cycle. Since the individual heating circuits are processed in succession, this is extremely time-consuming, that is to say the time taken increases linearly with the number of control circuits to be tested.

To illustrate the problem behind the present invention, FIG. 1 provides a diagram containing measurement data of an incorrectly wired heating system. In this context, in the diagram shown in FIG. 1, time data are plotted on the x-axis and temperature data are plotted on the y-axis. The time data along the x-axis of the present diagram are measurement times at which heat measurements were carried out on heating members of an aircraft. The temperature data along the y-axis are the respective temperatures of the heating members at the respective measuring points arranged along the x-axis.

The simulated heating system which forms the basis for the measurement data of the present diagram is provided for preventing a temperature decrease in components of the aircraft. The temperature range to be achieved by the respective heating members is preferably between 6° C. and 10° C. However, because in the example shown the wires between a control element and the respective heating members are connected the wrong way around in the heating system which is taken as a basis, the desired temperature range for the heating members is not achieved. Accordingly, the heating members which form the basis for the temperature curves K1 and K2 are actuated or activated too frequently, whereas the heating members which form the basis for the temperature curves K3 and K4 are addressed or activated too infrequently. This can lead to a temperature increase in individual components in the test arrangement, as is shown by the temperature curves K1 and K2. Further, as a result of the progression of the temperature curves K3 and K4, there may be a decrease in temperature in the components of the aircraft in the test arrangement. In accordance with conventional methods, identifying the wiring which is the wrong way around requires a large amount of testing.

SUMMARY OF THE INVENTION

Accordingly, an object of the present invention is to provide a method and a device which make it possible to provide an allocation of a plurality of appliances to at least one further device as regards the correct wiring thereof, in particular as regards the presence of a provided wiring.

This object is achieved by a method for identifying an allocation of control circuits to at least one control device according to claim 1.

Accordingly, a method for identifying an allocation of control circuits to at least one control device is provided, the method for identifying an allocation of control circuits comprising the following steps:

providing an actuation pattern which is suitable for uniquely actuating an individual control circuit via the control device;

measuring a further actuation pattern when the control circuits are actuated in accordance with the provided actuation pattern; and identifying the allocation of the control circuits to the at least one control device by comparing the provided actuation pattern and the measured actuation pattern.

Control circuits may be allocated to at least one control device for example by means of wiring, each control circuit being wired to a control device. For example, it is possible for a particular number m of control circuits to be wired to a particular number n of control devices. In this context, any desired subset of the control circuits m can be wired to any desired number of control devices n. For example, three control circuits can be wired to a first control device and two further control circuits can be wired to a second control device.

Control circuits can be allocated to at least one control device for example by means of a stored table which assigns a number of control circuits to each of a particular number of control devices. Accordingly, control circuits can also be actuated by means of a wireless interface of the control device. It is further possible for interfaces which are used for communication with the individual control circuits to be provided in the control device.

A control circuit may comprise any desired actuator and any desired sensor. In this context, an actuator may for example be in the form of a heating member. A sensor may for example be formed by a heat detector. The sensor is suitable for monitoring at least one action or at least one state of an associated actuator. Further examples of a specific configuration of an actuator or a sensor are a light source together with a brightness sensor, a motor together with a rotational speed meter, or a pump together with a pressure meter. In this context, the average person skilled in the art will be aware of a number of further possibilities for the specific configuration of an actuator or sensor.

The control device is suitable for controlling at least one control circuit. The control device may for example be suitable for causing a heating member to heat up. The resulting state change of the heating member, specifically an increase in temperature, can now be determined by means of a corresponding temperature detector. The control device may also be referred to as a central control unit, which actuates at least a selection of control circuits. The control device may be suitable for reading out a sensor of the control circuit and actuating the associated actuator as a function of the sensor value which is read out.

At least one control circuit is actuated as a function of at least one actuation pattern. In this context, an actuation pattern comprises a reference to control circuits which are to be actuated. The actuation pattern may for example state individual control circuits which are to be actuated in accordance with a predetermined action. The actuation pattern can specify individual control circuits by means of an identifier, and in doing so can specify in what manner these same control circuits are to be addressed. If the control circuit comprises a heating member, it can be specified in the actuation pattern that this heating member is to be heated up at a particular time, for example during a time interval. In this context, the actuation pattern defines for example an electric voltage which is applied to the heating member so as to heat it up. It is advantageous to specify a time interval, for example for a heating phase in minutes, which specifies the time required for heating up the corresponding heating member. It is further possible to define a temperature threshold above which the heating member is no longer actuated or activated.

For uniquely actuating the individual control circuit, an identifier is assigned to each control circuit, for example as a function of a serial number. It is further possible to actuate the individual control circuits by means of the interface which is provided for this purpose. In this context, the individual control circuit is not actuated directly, but instead, the interface which is provided for the respective control circuit is actuated.

The actuation pattern is preferably provided by reading out a data memory. In this way, an actuation pattern relating to a machine which is to be delivered by the manufacturer of the machine can be stored on a data memory within the machine. It is further possible to define the actuation pattern dynamically as a function of the number of control circuits and the number of control devices. In this context, an individual actuation pattern is provided in that one of a plurality of actuation patterns is selected as a function of the number of control circuits. A stored table, which defines which actuation pattern is to be selected if there is a particular number of control circuits and a particular number of control devices, may be provided for this purpose. Further, the actuation pattern can be calculated by means of at least one calculation step. Algorithms which generate all of the possibilities, that is to say all of the possible permutations of control circuits and control devices, and thus generate a unique pattern in each case for identifying the respective control circuit, are suitable for this purpose. In this context, it is possible by means of the algorithm to determine a binary code which is suitable for uniquely actuating each individual control circuit. In this context it is advantageous if a different binary code is calculated in relation to each individual control circuit, by means of which code this same control circuit can be uniquely addressed. Thus, an actuation pattern may comprise a binary code for each control circuit. In addition, it may be specified in the actuation pattern whether the respective control circuit of the binary codes is to be actuated or not. This may be implemented by switching on an actuation bit.

Once an actuation pattern has been provided, the control circuits are actuated in accordance with this provided actuation pattern. In this context, the provided actuation pattern can be read out, and precisely the control circuits which are identified in the provided actuation pattern can be addressed. This is referred to as applying the actuation pattern to the individual control circuits. If the individual control circuits are addressed in accordance with the provided actuation pattern, the individual control circuits or the actuators of the respective control circuits carry out the action which is predetermined in the actuation pattern. For example, if the actuation pattern specifies that all of the heating members having an even binary code are to be addressed, it should be expected in the case of correct wiring that there will be a measurable temperature increase in heating members having an even binary code. The measurement of the state change of the respective actuators is stored in a further actuation pattern. In this way, a further actuation pattern known as the actual actuation pattern is measured. In the case of correct wiring, it should be expected that the provided first actuation pattern will correspond to the measured second actuation pattern. If the first, provided actuation pattern and the second, measured actuation pattern do not correspond, it is possible that the wrong actuators are being addressed as a result of incorrect wiring.

The allocation of control circuits to at least one control device can now be read out from the provided first actuation pattern and the measured second actuation pattern. This is carried out for example by comparing the provided actuation pattern with the measured actuation pattern.

The proposed method can be used for example before delivering an aircraft, and as a result, any incorrect wiring within the aircraft is detected early on, with a small amount of testing.

In one embodiment of the method for identifying an allocation of control circuits, the provided actuation pattern and/or the measured actuation pattern comprises actuation phases.

This has the advantage that the actuation patterns are subdivided into individual phases, in accordance with which the control circuits can for example be actuated alternately. It is thus possible to check all of the permutations of the allocation of control circuits to control devices and analyse them accordingly.

In a further embodiment of the method for identifying an allocation of control circuits, the actuation phases describe a selection of control circuits which are to be actuated.

This has the advantage that in each case a selection of control circuits which are to be actuated can be addressed, and thus a plurality of control circuits can be tested in each phase.

In a further embodiment of the method for identifying an allocation of control circuits, the control circuits are actuated by carrying out the actuation phases.

This has the advantage that the actuation phases can be processed successively or can even be processed in particular sequences which are defined for example in an actuation pattern.

In a further embodiment of the method for identifying an allocation of control circuits, the provided actuation pattern and/or the measured actuation pattern are represented by at least one binary code.

This has the advantage that the actuation patterns can be stored and/or processed efficiently if the individual control circuits are actuated in accordance with a binary action. In this context, it is also possible for other codes to be used, which are based for example on a different number system.

In a further embodiment of the method for identifying an allocation of control circuits, the number of positions in at least one binary code is equal to the number of actuation phases.

This has the advantage that the actuation phases can be processed bitwise. That is to say, during each actuation phase a predefined position of the binary code is checked as to whether the corresponding bit in this position is on or off, and the respective control circuit is actuated as a function of this bit.

In a further embodiment of the method for identifying an allocation of control circuits, the provided actuation pattern and/or the measured actuation pattern are in the form of at least one stored table.

This has the advantage that the actuation pattern can be provided in a clear manner and in accordance with pre-existing data models.

In a further embodiment of the method for identifying an allocation of control circuits, columns of the table describe the actuation phases and rows of the table describe the binary codes.

This has the advantage that the actuation patterns are in an intuitively comprehensible form and that the binary code of the respective control circuit can be read out row by row from the stored table.

In a further embodiment of the method for identifying an allocation of control circuits, the control device is in the form of at least a management device, a monitoring device, a measuring device and/or an evaluation device.

This has the advantage that the control device can be in the form of a plurality of pre-existing devices or units.

In a further embodiment of the method for identifying an allocation of control circuits, the control circuits each comprise at least one sensor and at least one actuator which is to be actuated.

This has the advantage that a control circuit can carry out a predetermined action and that this action can be measured, for example in the form of a state measurement.

In a further embodiment of the method for identifying an allocation of control circuits, the control circuits are in the form of heating circuits.

This has the advantage that the present invention can be used in particular in vehicle construction or in aircraft construction.

The object is further achieved by a device for identifying an allocation of control circuits to at least one control device, in particular by carrying out the above-disclosed methods, the device for identifying an allocation of control circuits to at least one control device comprising:
    a provision device for providing an actuation pattern which is suitable for uniquely actuating each individual control circuit by way of the control device;
    a measurement device for measuring a further actuation pattern when the control circuits are actuated in accordance with the provided actuation pattern; and
    an identification device for identifying the allocation of the control circuits to the at least one control device by comparing the provided actuation pattern and the measured actuation pattern.

A computer program product, comprising program instructions for carrying out the above-disclosed method, and a data memory, for storing the computer program product, are further provided.

BRIEF DESCRIPTION OF THE DRAWINGS

Further advantageous configurations of the invention form the subject matter of the dependent claims and of the embodiments which are described in the following. In addition, the invention is explained in greater detail by way of example implementations, with reference to the appended drawings, in which:

FIG. 2 is a flow chart of a method for identifying an allocation of control circuits to at least one control device in accordance with an embodiment of the present invention;

FIG. 3 is a detailed flow chart of a method for identifying an allocation of control circuits to at least one control device in accordance with an embodiment of the present invention;

In the drawings, like or functionally equivalent elements have been provided with like reference numerals, unless stated otherwise.

DETAILED DESCRIPTION OF THE INVENTION

Figure 1:
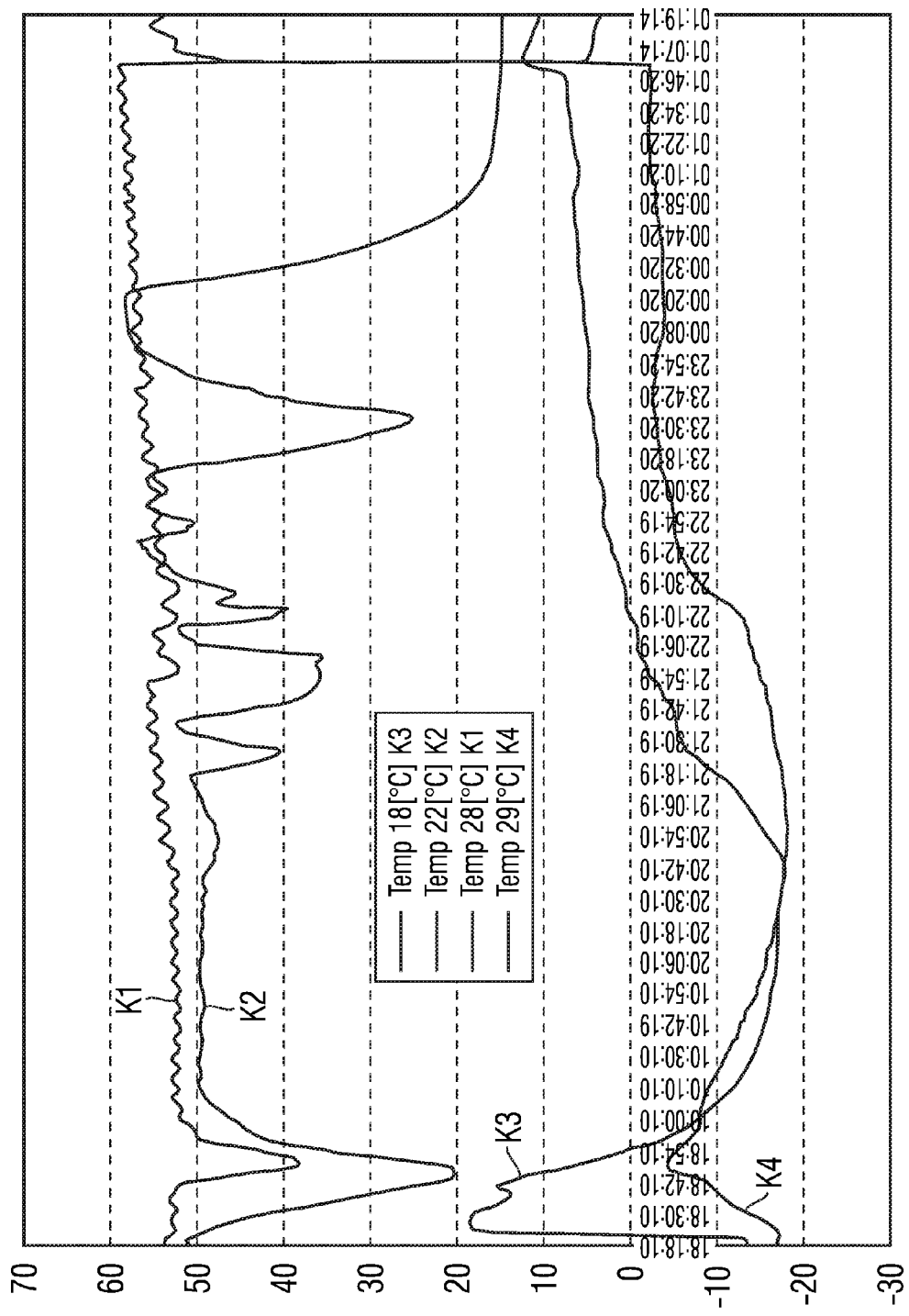
FIG. 1 is a signal diagram illustrating the set of problems behind the invention, as described previously in the introduction to the description.

FIG. 2 is a flow chart of a method for identifying an allocation of control circuits to at least one control device and basically comprises three steps.

Initially, in a step 100, an actuation pattern is provided which is suitable for uniquely actuating each individual control circuit by way of the control device. Subsequently, in a step 101, a further actuation pattern is measured when the control circuits are actuated in accordance with the provided actuation pattern. Finally, in step 102, the allocation of the control circuits to the at least one control device is identified by comparing the provided actuation pattern and the measured actuation pattern.

The above-disclosed method steps may be carried out iteratively and/or in a different order and may comprise further sub-steps.

FIG. 3 is a more detailed flow diagram of the method for identifying an allocation of control circuits to at least one control device and comprises the following steps.

In two preparatory method steps 200 and 201, control circuits RK are identified in a method step 200 and control devices RV are identified in a method step 201. Identifying control circuits RK may involve checking for the presence of control circuits RK, and this is carried out for example by checking plug-in connections of wiring or the reception of a status signal of at least one control circuit RK. Control circuits RK which are to be actuated by means of at least one control device RV may also be identified by reading out a blueprint, in particular by reading out a stored blueprint of an aircraft. So, for example, for a type of aircraft it is known from the blueprint thereof which control circuits RK have to be present in this same aircraft.

It may further be necessary to identify at least the number of control devices RV. This is advantageous in particular if there are a plurality of control devices RV for actuating the control circuits RK. In this case, not only are control circuits RK each connected to an individual control device RV, but the control circuits RK are connected to a plurality of control devices RV. In this context, it is advantageous if a control circuit RK is merely actuated by an associated control device RV. Typically, control devices RV are suitable for actuating a plurality of control circuits RK.

In a subsequent method step 202, at least part of an actuation pattern AM is provided. If the actuation pattern AM comprises a plurality of actuation phases, an individual actuation phase can be provided in the method step 202. However, a selection of the actuation phases comprised in the actuation pattern AM may also be provided. Providing at least part of an actuation pattern AM typically includes further sub-steps, such as calculating the actuation pattern AM. The actuation pattern may comprise all of the permutations of on and off states of the control circuits RK. In this way, the actuation pattern AM is suitable for representing all of the combinations of an actuation or non-actuation of control circuits. As a result, it can be uniquely identified in subsequent method steps whether the actuation pattern AM, which is provided at least in part in the method step 202, is actually implemented by way of the actuation control circuits RK.

The at least one part of the actuation pattern AM may be provided by selecting an actuation pattern from a plurality of provided actuation patterns. In this context, it is possible to provide a specific actuation pattern in relation to an aircraft type in preparatory method steps. In this way, in relation to a plurality of aircraft, it is further possible to provide an actuation pattern AM in each case and to store it in a data memory. An actuation pattern AM is subsequently selected in accordance with the aircraft type of the aircraft in which the control circuits RK and the control device RV are installed. As a result, in one embodiment, the method step 202 comprises reading out an actuation pattern AM from a data memory.

In a subsequent method step 203, at least one control circuit RK is actuated in accordance with the at least one part of the actuation pattern AM which is provided in the method step 202. If the actuation pattern AM comprises phases, this same actuation phase can be carried out in the method step 203. As a result, in the method step 203, the control circuits RK which are specified in the part of the provided actuation pattern AM or the actuation phase are actuated. In this context, it is advantageous to actuate a selection or a plurality of control circuits RK in each actuation phase.

The actuation of the control circuits RK in the method step 203 results in a state change of the control circuit RK of which the state is measured in a subsequent method step 204. For example, in the method step 203 an actuator which is provided in the control circuit RK is actuated. If a further sensor is included in the control circuit RK, this same sensor is read out in the method step 204. The measurement which is carried out in the method step 204 may for example comprise reading out a temperature sensor, a rotational speed meter, a pressure meter and/or reading out an imaging sensor of the control circuit RK.

Once method step 204 has been carried out, it may be advantageous to carry out the method steps 202, 203 and 204 again. If an actuation phase has been provided in the method step 202, after the control circuits RK have been actuated in accordance with this implementation phase and the resulting state change has been measured, a further actuation phase can be provided in the method step 202. The measured state changes can be stored or combined to form an implementation pattern in a method step 205.

In some cases, a measured implementation pattern is provided in a method step 205. In this context, the measured implementation pattern provides an indication as to which control circuits RK are actually actuated when a provided actuation pattern AM is actuated. Therefore, the provided actuation pattern AM can be referred to as a theoretical actuation pattern or target actuation pattern, and the actuation pattern AM' which is measured in the method step 205 can be referred to as the actual or current actuation pattern.

In a subsequent method step 206, the actuation pattern AM which is provided by iteratively carrying out method step 202 is compared with the actuation pattern AM' which is measured in the method step 205. In this context, it is advantageous if the provided actuation pattern AM and the measured actuation pattern AM' are stored in the same data format. For example, the provided actuation pattern AM and the measured actuation pattern AM' may each be in the form of a stored table and are compared with one another in the method step 206. In this context, the comparison may be carried out cell by cell, column by column and/or row by row. Further, it is possible for the provided actuation pattern AM and the measured actuation pattern AM' to be in the form of binary codes. In this context, the respective binary codes can be compared in the method step 206. There are a plurality of options for comparing binary codes, for example algorithms for measuring a distance between strings. In particular, pattern recognition procedures may also be used in the method step 206.

In the method step 206, differences between the provided actuation pattern AM and the measured actuation pattern AM' are identified. It is thus possible, in the method step 207, to identify an existing actual allocation of control circuits RK to control devices RV. Identifying the allocation of control circuits RK to at least one control device RV is shown schematically in FIG. 6 in accordance with a preferred embodiment.

In a further, optional method step 208, an incorrect allocation of control circuits RK to at least one control device RV can be corrected. In this context, it is possible merely to swap the actuation of interfaces in future actuations. For example, if the wiring of a first control circuit RK1 and the wiring of a second control circuit are the wrong way around, the interface of the second control circuit RK2 can be addressed for future actuations of the first control circuit RK1, but without correcting the physical wiring. In this way, efficient error correction is possible as regards the wiring.

The above-disclosed method steps may be carried out iteratively and/or in a different order, and may comprise further sub-steps.

Figure 4:
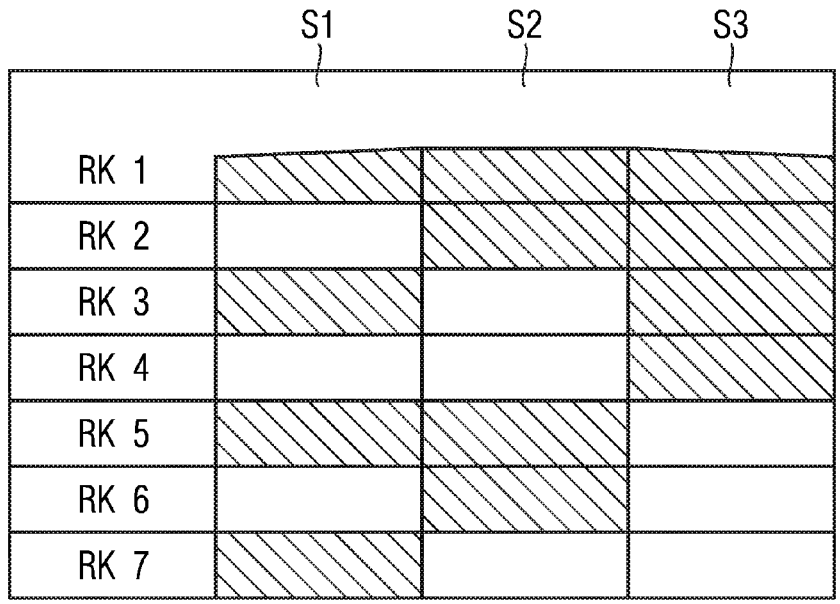
FIG. 4 is a schematic drawing of an actuation pattern in accordance with an embodiment of the present invention.

FIG. 4 is a schematic drawing of an actuation pattern AM in accordance with an embodiment of the present invention. With the actuation pattern AM which is shown in the present FIG. 4, eight control circuits RK, shown in the left-hand column, can be actuated. The other columns S1, S2 and S3 show actuation phases which together constitute the actuation pattern AM. In a first actuation phase of the control circuits RK1-RK7, namely the actuation phase S1, the selection of the first, third, fifth and seventh control circuits RK is addressed. This is shown in the table by way of shaded cells. In a second actuation phase in accordance with S2, only the control circuits RK1, RK2, RK5 and RK6 are actuated. In this way, a unique actuation pattern AM is provided for each of the control circuits RK1-RK7. Each of the control circuits RK can be uniquely identified by exactly one row in the present table, and can thus be uniquely actuated.

In the present embodiment, the control circuits RK are actuated in a binary manner. That is to say, control circuits RK are either actuated (activated) or not actuated (deactivated). This results in a unique actuation of the control circuits RK in accordance with a binary code which is unique to each row. For example, the binary code by means of which the seventh control circuit RK7 is actuated can be denoted as 100. The binary code with which the control circuit RK5 is addressed can be denoted for example as the binary code word 110. It is thus possible to assign a binary code or a binary code word to each individual control circuit RK1-RK7, all of the binary codes together constituting the control pattern AM. Therefore, in the table shown in the present FIG. 4, an actuation phase can be derived from each column and a binary code can be derived from each row.

To compare a provided actuation pattern AM and a measured actuation pattern AM', a first table in accordance with the provided actuation pattern AM and a second table in accordance with the measured actuation pattern AM' can be superimposed on one another, and deviations or differences in the two actuation patterns can thus be identified. In this context, each detected deviation gives an indication as to an incorrectly wired control circuit RK.

Figure 5:
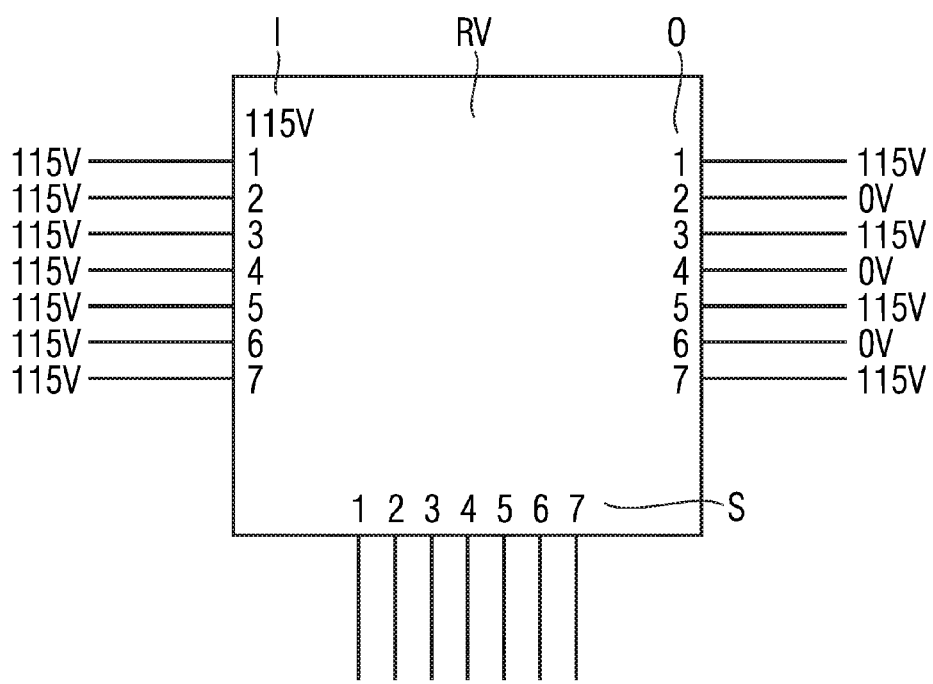
FIG. 5 is a schematic drawing of a control device in accordance with an embodiment of the present invention.

FIG. 5 is a schematic drawing of a control device RV which is suitable for receiving input signals I and for generating output signals O. In the present embodiment, the control device RV further comprises sensor inputs S. A plurality of control circuits RK, eight in the present embodiment, can be addressed by means of the control device RV. In this context, in the present example, an input signal I can be applied at a voltage of 115 V, and a voltage distribution in accordance with the provided actuation pattern AM can be provided as the output signal. The provided actuation pattern AM which is shown in the present FIG. 5 may for example be the first actuation phase in accordance with FIG. 4.

The control device RV shown in FIG. 5 may for example be an IPCU or ice protection control unit. An IPCU of this type is used in aircraft for actuating heating members, in particular for preventing pipelines from icing up.

Figure 6:
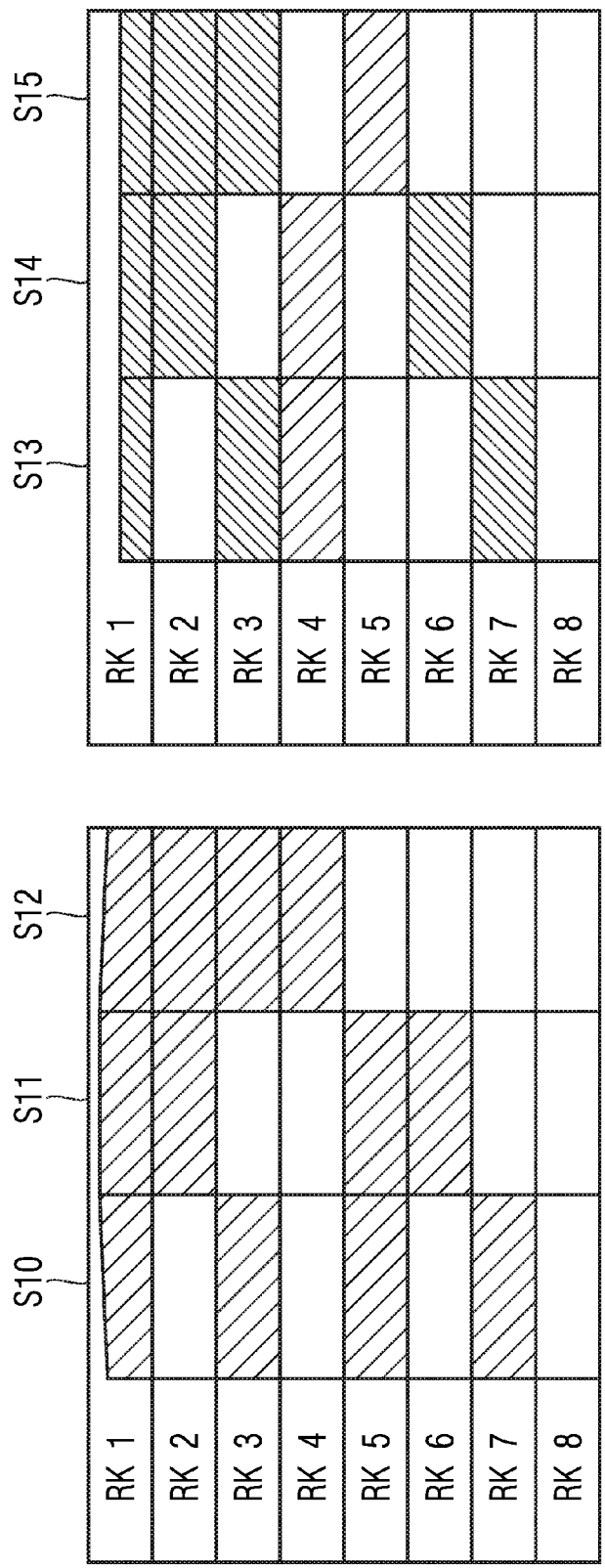
FIG. 6 is a schematic drawing of a provided actuation pattern and a measured actuation pattern in accordance with an embodiment of the present invention.

FIG. 6 shows two actuation patterns AM, namely a provided actuation pattern AM and a measured actuation pattern AM' in accordance with an embodiment of the present invention.

The provided actuation pattern AM in accordance with columns S10-S12 may be the actuation pattern AM shown in FIG. 4. This actuation pattern AM in accordance with columns S10-S12 may also be referred to as an expected actuation pattern. Each of the control circuits RK can be uniquely identified in the present table by exactly one row of the table, and can thus be uniquely actuated.

Columns S13-S15 represent a measured actuation pattern AM'. In this context, the columns and rows are divided up analogously to the provided actuation pattern AM in accordance with columns S10-12. Thus, the two actuation patterns, namely the provided actuation pattern AM and the measured actuation pattern AM', are in the same data format. This is advantageous in particular because deviations in the provided actuation pattern AM and in the measured actuation pattern AM' can be identified using row-by-row comparison.

In the example shown in FIG. 6, the wiring, that is to say the allocation, of the fourth control circuit RK4 and the wiring of the fifth control circuit RK5 are the wrong way around. By comparing the control pattern according to the control circuits RK4 and RK5 row by row, it is identified that there is a deviation between the expected actuation pattern and the actual actuation pattern. Further, in the present table it can be identified that swapping the binary codes of the fourth control circuit RK4 with the binary codes of the fifth control circuit RK5 in accordance with the columns S13, S14 and S15 corrects the incorrect actuation. It is thus possible, during further actuations, to address the control circuit RK4 by means of the interface of the control circuit RK5, and to address control circuit by means of the interface of the control circuit RK4.

As a result, the actual allocation of control circuits RK to a control device RV is implemented.

Figure 7:
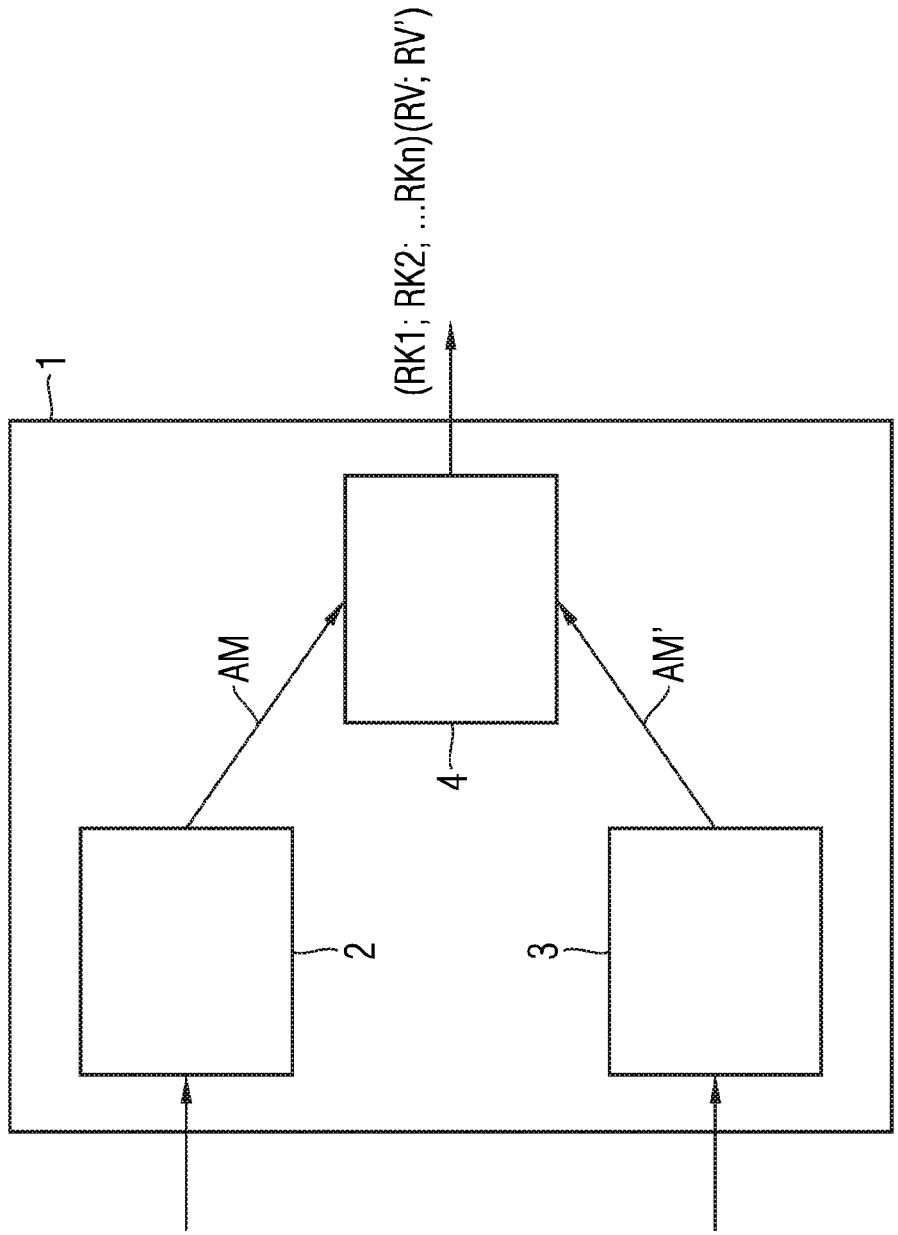
FIG. 7 is a block diagram of a device for identifying an allocation of control circuits to at least one control device in accordance with an embodiment of the present invention.

FIG. 7 is a block diagram of a device 1 for identifying an allocation of control circuits RK1; RK2; . . . ; RKn to at least one control device RV.

This device comprises a provision means 2 for providing an actuation pattern AM which is suitable for uniquely actuating each individual control circuit RK1; RK2; . . . ; RKn via the control device RV.

Further, a measurement device 3 is provided for measuring a further actuation pattern AM' during an actuation of the control circuits RK1; RK2; . . . ; RKn in accordance with the provided actuation pattern AM.

The device 1 further comprises an identification device 4 for identifying the allocation of the control circuits RK1; RK2; ... ; RKn to the at least one control device RV by comparing the provided actuation pattern AM and the measured actuation pattern AM'.

The provision device 2 may have an input which is suitable for reading out an actuation pattern AM from a data memory or receiving it via the interface. The measurement device 3 may have an input which communicates with a measurement detector which is provided in a control circuit RK1; RK2; ... ; RKn. the identification device 4 may output an allocation of control circuit RK1; RK2; ... ; RKn to at least one control device RV, RV'.

Figure 8:
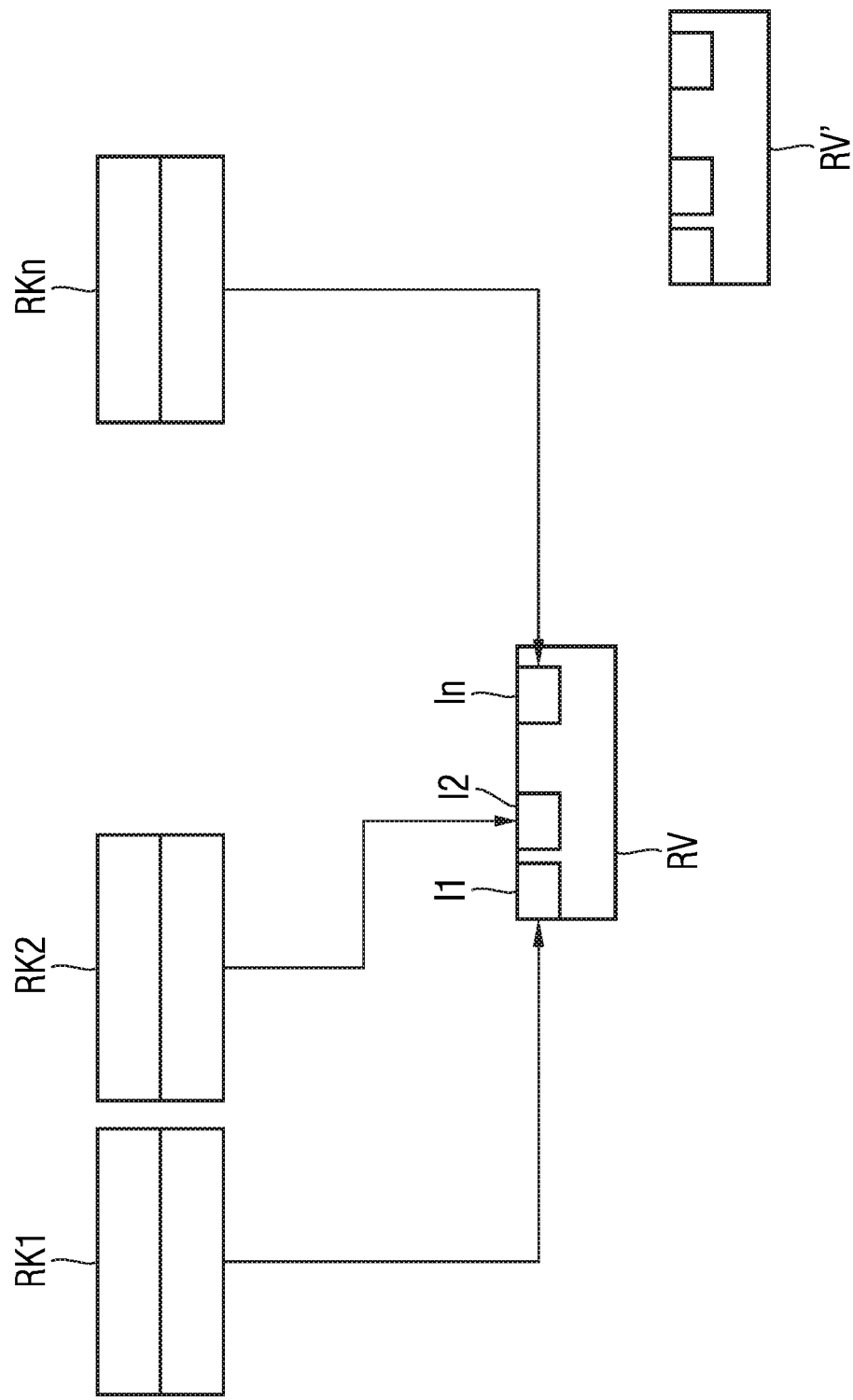
FIG. 8 is a schematic drawing of a plurality of control circuits together with control devices in accordance with an embodiment of the present invention.

FIG. 8 is a schematic drawing of an allocation of control circuits RK1; RK2; ... ; RKn to at least one control device RV, RV'. In the present embodiment, each of the control circuits RK1; RK2; ... ; RKn comprises at least an actuator and a sensor. This is shown in the present FIG. 8 in that the respective control circuits RK1; RK2; ... ; RKn are divided in two. The respective control circuits RK1; RK2; ... ; RKn are each connected to the control device RV via an interface I1; I2; ... ; In. In this context, it is possible for the control device RV to actuate the individual actuators by means of an actuation pattern AM. The provided actuation pattern AM can for example be transferred to the control device RV by means of the provision device 2 shown in FIG. 7. It is further possible for the input of the measuring device 3 shown in FIG. 7 to be connected to a sensor of each of the control circuits RK1; RK2; ... ; RKn. In the present embodiment, a further control device RV' is provided, to which further control circuits can be connected.

The allocation shown in the present FIG. 8 of control circuits RK1; RK2; ... ; RKn to the at least one control device RV can be identified for example by means of an actuation pattern AM in accordance with FIG. 9.

Figure 9:
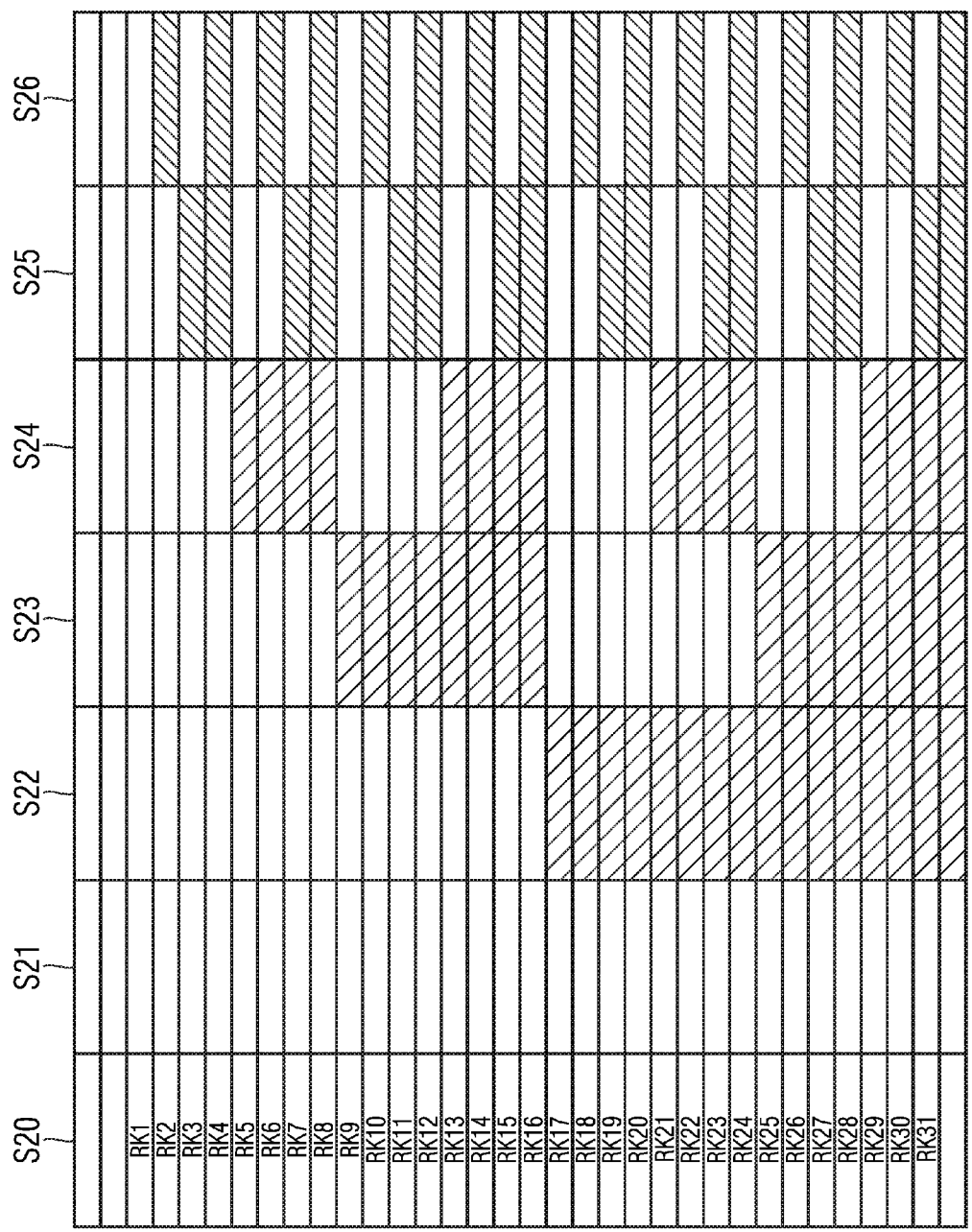
FIG. 9 is a schematic drawing of a provided actuation pattern in accordance with an embodiment of the present invention.

FIG. 9 is a schematic drawing of a provided actuation pattern AM, the provided actuation pattern AM being represented by means of the columns S20, S21, S22, S23, S24, S25 and S26. Each of the control circuits RK can be uniquely identified in the present table by means of exactly one row Rk1-Rk32 and can thus be uniquely actuated.

In the present embodiment, the actuation pattern AM is a heating pattern, which is switched on at heating member connections by means of a heater controller. The heater controller may for example be provided in the control device RV, it being possible for a control circuit RK to be in the form of a heating circuit. By switching on predefined heating patterns, the heating periods for identifying an allocation of heating circuits for at least one heater controller are minimised. A typical heater controller, also known as an IPCU or ice protection control unit, has 32 heater connections. For the use of predefined actuation patterns, the number of heating periods is reduced from 32 to 6 per controller. When 4-6 controllers are used per aircraft, the number of heating cycles can therefore be minimised. For example, a particular aircraft has six IPCUs in a heating system, having 32 heating circuits each, resulting in 6×32=192 test cycles when manually testing the individual heaters. If predefined testing patterns are actuated, the system can be tested in 8 heating cycles. This is equivalent to a saving of 192−8=184 cycles, and 184 cycles×5 min=920 min. In this context, a heating cycle typically lasts 5 minutes.

The invention claimed is:

1. A method for identifying an allocation of control circuits, which each comprise an actuator and a sensor, to at least one control device comprising:
providing a first actuation pattern which is suitable for actuating a plurality of individual control circuits simultaneously via the control device, comprising a plurality of actuation phases which each describe the plurality of individual control circuits which are to be actuated in the corresponding actuation phase simultaneously, the number of actuation phases being less than the number of control circuits;
actuating the actuators of the plurality of individual control circuits in accordance with one of the plurality of actuation phases by the control device;
reading out the sensors of the actuated plurality of individual control circuits in accordance with the one of the plurality of actuation phases;
repeating the steps of actuating and reading out for each of the plurality of actuation phases so as to measure a second actuation pattern; and
identifying the allocation of each of the plurality of individual control circuits to the at least one control device by comparing the provided actuation pattern and the measured actuation pattern, wherein the provided actuation pattern and/or the measured actuation pattern is represented by at least one binary code, wherein every digit of the binary code represents one activated or deactivated control circuit respectively, wherein the number of positions in at least one binary code is equal to the number of actuation phases, and wherein the number of binary codes which represent the provided actuation pattern and/or the measured actuation pattern is equal to the number of control circuits.

2. The method according to claim 1, wherein the provided actuation pattern and/or the measured actuation pattern are in the form of at least one stored table.

3. The method according to claim 2, wherein columns of the stored table specify the actuation phases and rows of the stored table specify the binary codes.

4. A device for identifying an allocation of control circuits, which each comprise an actuator and a sensor, to at least one control device, comprising:
a provision device for providing an actuation pattern which is provided for actuating a plurality of individual control circuits simultaneously by way of the control device, comprising a plurality of actuation phases, which each describe the plurality of individual control circuits which are to be actuated in the corresponding actuation phase simultaneously, the number of actuation phases being less than the number of control circuits;
a measurement device for measuring a second actuation pattern during a repetition of the actuation of the plurality of individual control circuits via the control device in accordance with one of the plurality of actuation phases and the reading-out of the sensors of the actuated plurality of individual control circuits in accordance with one of the plurality of actuation phases; and
an identification device for identifying the allocation of the plurality of individual control circuits to the at least one control device by comparing the provided actuation pattern and the measured actuation pattern, wherein the provided actuation pattern and/or the measured actuation pattern is represented by at least one binary code, wherein every digit of the binary code represents one activated or deactivated control circuit respectively, wherein the number of positions in at least one binary code is equal to the number of actuation phases, and wherein the number of binary codes which represent the provided actuation pattern and/or the measured actuation pattern is equal to the number of control circuits.

5. The device according to claim 4, wherein the control device is in the form of at least a management device, a monitoring device, a measuring device and/or an evaluation device.

6. The device according claim 4, wherein the plurality of individual control circuits are heating circuits and wherein the actuators are heating members.

7. A computer program product comprising program instructions for carrying out the method according to claim 1.

8. A non-transitory data memory, which stores the computer program product according to claim 7.

9. A method for identifying an allocation of control circuits, which each comprise an actuator and a sensor, to at least one control device, the method comprising:
providing a first actuation pattern which is suitable for actuating a plurality of individual control circuits simultaneously via the control device, comprising a plurality of actuation phases which each describe the plurality of individual control circuits which are to be actuated in the corresponding actuation phase simultaneously, the number of actuation phases being less than the number of control circuits, wherein the first actuation pattern is a heating pattern switched on by an ice protection control unit (IPCU);
actuating the actuators of the plurality of individual control circuits in accordance with one of the plurality of actuation phases by the control device;
reading out the sensors of the actuated plurality of individual control circuits in accordance with the one of the plurality of actuation phases;
repeating the steps of actuating and reading out for each of the plurality of actuation phases so as to measure a second actuation pattern; and
identifying the allocation of each of the plurality of individual control circuits to the at least one control device by comparing the provided actuation pattern and the measured actuation pattern, wherein the provided actuation pattern and/or the measured actuation pattern is represented by at least one binary code, wherein every digit of the binary code represents one activated or deactivated control circuit respectively, wherein the number of positions in at least one binary code is equal to the number of actuation phases, and wherein the number of binary codes which represent the provided actuation pattern and/or the measured actuation pattern is equal to the number of control circuits.

* * * * *